(12) United States Patent
Park

(10) Patent No.: US 9,130,180 B2
(45) Date of Patent: Sep. 8, 2015

(54) IMAGE SENSOR WITH ORGANIC PHOTOELECTRIC LAYER

(71) Applicant: Samsung Electronics Co., Ltd., Suwon-si (KR)

(72) Inventor: Wonje Park, Yongi-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/206,229

(22) Filed: Mar. 12, 2014

(65) Prior Publication Data

US 2014/0264298 A1 Sep. 18, 2014

(30) Foreign Application Priority Data

Mar. 15, 2013 (KR) .................. 10-2013-0028044

(51) Int. Cl.
*H01L 51/44* (2006.01)
*H01L 31/0216* (2014.01)
*H01L 27/28* (2006.01)
*H01L 51/42* (2006.01)

(52) U.S. Cl.
CPC ............... *H01L 51/44* (2013.01); *H01L 27/28* (2013.01); *H01L 31/02162* (2013.01); *H01L 51/42* (2013.01); *Y02E 10/549* (2013.01)

(58) Field of Classification Search
None
See application file for complete search history.

(56) References Cited

U.S. PATENT DOCUMENTS

| | | |
|---|---|---|
| 7,129,466 B2 | 10/2006 | Iwasaki |
| 2008/0157140 A1 | 7/2008 | Cho |
| 2008/0246853 A1 | 10/2008 | Takizawa et al. |
| 2010/0006968 A1 | 1/2010 | Lee et al. |
| 2010/0053387 A1 | 3/2010 | Kim et al. |
| 2011/0019042 A1 | 1/2011 | Yamaguchi |
| 2012/0025179 A1* | 2/2012 | Mitsui et al. .................... 257/40 |
| 2013/0001730 A1* | 1/2013 | Miyanami ..................... 257/443 |
| 2013/0020663 A1* | 1/2013 | Takimoto ...................... 257/431 |
| 2013/0087682 A1* | 4/2013 | Nomura ......................... 250/206 |
| 2013/0320309 A1* | 12/2013 | Kim et al. ........................ 257/40 |

FOREIGN PATENT DOCUMENTS

| | | |
|---|---|---|
| JP | 2003-332551 | 11/2003 |
| JP | 2011-029337 | 2/2011 |
| KR | 1020080061029 A | 7/2008 |
| KR | 1020080091023 A | 10/2008 |
| KR | 1020100007257 A | 1/2010 |
| KR | 1020100024759 A | 3/2010 |
| KR | 1020100068992 A | 6/2010 |
| KR | 1020110052256 A | 5/2011 |

* cited by examiner

*Primary Examiner* — Daniel Luke
(74) *Attorney, Agent, or Firm* — Myers Bigel Sibley & Sajovec, PA

(57) ABSTRACT

An image sensor is provided. The image sensor includes an interlayered dielectric structure having a first recess region, in which an organic photoelectric layer is provided, and a second recess region, in which a color filter is provided. The second recess region may be provided under the first recess region.

15 Claims, 22 Drawing Sheets

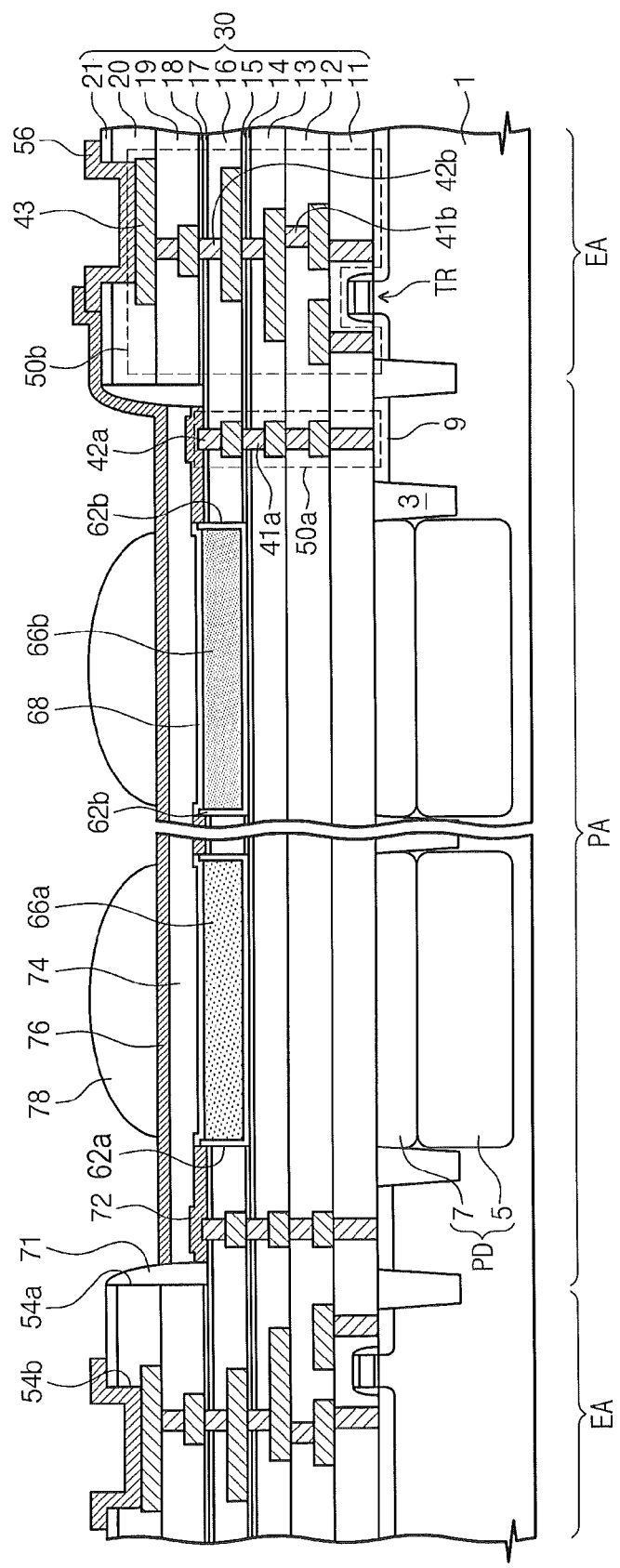

IMAGE SENSOR WITH ORGANIC PHOTOELECTRIC LAYER

CROSS-REFERENCE TO RELATED APPLICATIONS

This U.S. non-provisional patent application claims priority under 35 U.S.C. §119 to Korean Patent Application No. 10-2013-0028044, filed on Mar. 15, 2013, in the Korean Intellectual Property Office, the entire contents of which are hereby incorporated by reference.

BACKGROUND OF THE INVENTION

Example embodiments of the inventive concept relate to an image sensor and a method of fabricating the same.

Image sensors are semiconductor devices capable of converting electrical signals into optical images. Image sensors may be classified into various types, including charge coupled device (CCD) type and complementary metal oxide semiconductor (CMOS) type. A CMOS image sensor (CIS) includes pixels arranged in two dimensions. Each of the pixels includes a photodiode (PD), which converts incident light into an electrical signal.

SUMMARY

Example embodiments of the inventive concept provide a highly-integrated image sensor configured to reduce a cross-talk problem.

Other example embodiments of the inventive concept provide a method of fabricating the image sensor.

According to example embodiments of the inventive concepts, an image sensor may include a substrate including a pixel region and a peripheral region, an interlayered dielectric structure disposed on the substrate to have a first recess region formed on the pixel region and a second recess region formed below a bottom of the first recess region, a color filter disposed in the second recess region, and an organic photoelectric layer disposed in the first recess region.

In example embodiments, the image sensor may further include a photoelectric conversion portion formed in the substrate, which overlaps the color filter, and a micro lens disposed on the organic photoelectric layer, which overlaps the color filter.

In example embodiments, the image sensor may further include a first transparent electrode disposed in the first recess region and below the organic photoelectric layer, and a second transparent electrode disposed in the first recess region and on the organic photoelectric layer.

In example embodiments, the image sensor may further include a conductive pad on the interlayered dielectric structure of the peripheral region. The second transparent electrode covers wholly a top surface of the organic photoelectric layer and extends to be in contact with the conductive pad.

In example embodiments, the image sensor may further include a spacer covering a sidewall of the first recess region and being in contact with the second transparent electrode.

In example embodiments, the image sensor may further include a storage node region formed in the substrate and electrically separated from the photoelectric conversion portion, and a first interconnection structure formed through the interlayered dielectric structure to connect the first transparent electrode electrically to the storage node region.

In example embodiments, the first interconnection structure may include a top portion protruding upward from the bottom of the first recess region.

In example embodiments, the image sensor may further include a second interconnection structure disposed on the peripheral region and electrically connected to the conductive pad. The first interconnection structure may include a plurality of first vias, the second interconnection structure may include a plurality of second vias, and at least one of the first vias may be disposed at the same level as that of one of the second vias.

In example embodiments, the first transparent electrode may overlap with the color filter.

In example embodiments, the image sensor may further include an etch stop layer interposed in at least one of a plurality of gaps between the first transparent electrode and the interlayered dielectric structure or between the color filter and the interlayered dielectric structure.

In example embodiments, the image sensor may further include a protection layer interposed in at least one of a plurality of gaps between the color filter and the interlayered dielectric structure or between the color filter and the organic photoelectric layer. The protection layer may be formed of at least one of oxide or nitride materials.

According to example embodiments of the inventive concepts, a method of fabricating an image sensor may include forming an interlayered dielectric structure on a substrate with a pixel region and a peripheral region, removing a portion of the interlayered dielectric structure on the pixel region to form a first recess region, removing another portion of the interlayered dielectric structure below a bottom of the first recess region to form a second recess region, forming a color filter in the second recess region, and forming an organic photoelectric layer in the first recess region.

In example embodiments, the method may further include forming a protection layer on the interlayered dielectric structure, before forming at least one of the color filter and the organic photoelectric layer.

In example embodiments, forming of the interlayered dielectric structure comprises forming a plurality of interlayered insulating layers and an etch stop layer. When the first and second recess regions are formed, the etch stop layer may be exposed.

In example embodiments, the method may further include forming a first interconnection structure and a second interconnection structure in the interlayered insulating layer to be provided on the pixel region and the peripheral region, respectively, forming a first transparent electrode below the organic photoelectric layer to be electrically connected to the first interconnection structure, and forming a second transparent electrode to cover wholly a top surface of the organic photoelectric layer. The first and second interconnection structures may include patterns that may be simultaneously formed using the same process.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 3 is a sectional view taken along line A-A' of FIG. 2.

Figure 1:
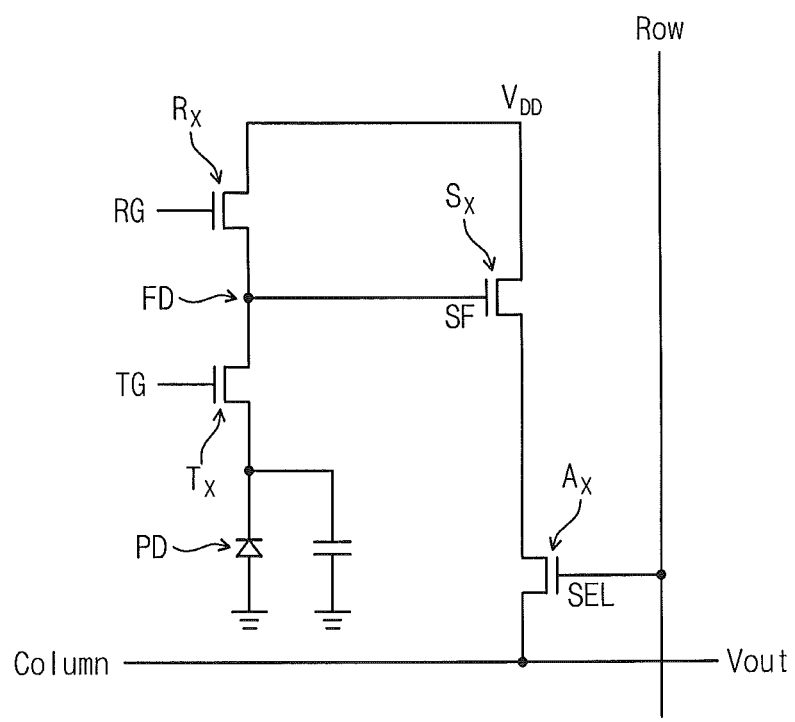
FIG. 1 is a circuit diagram of an image sensor according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout the description. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and this specification and will not be interpreted in an idealized or overly formal sense unless expressly so defined herein.

FIG. 1 is a circuit diagram of an image sensor according to example embodiments of the inventive concept.

Referring to FIG. 1, the image sensor may include a plurality of unit pixels, each of which includes a photoelectric conversion region PD, a transfer transistor Tx, a source follower transistor Sx, a reset transistor Rx, and a selection transistor Ax. The transfer transistor Tx, the source follower transistor Sx, the reset transistor Rx, and the selection transistor Ax may include a transfer gate TG, a source follower gate SF, a reset gate RG, and a selection gate SEL, respectively. A photoelectric conversion portion may be provided in the photoelectric conversion region PD. The photoelectric conversion portion may be a photodiode including an n-type impurity region and a p-type impurity region. The transfer transistor Tx may include a drain region serving as a floating diffusion region FD. The floating diffusion region FD may also serve as a source region of the reset transistor Rx. The floating diffusion region FD may be electrically connected to the source follower gate SF of the source follower transistor Sx. The source follower transistor Sx may be connected to the selection transistor Ax. The reset transistor Rx, the source follower transistor Sx, and the selection transistor Ax may be shared by adjacent pixels, and this makes it possible to increase an integration density of the image sensor.

Hereinafter, an operation of the image sensor will be described with reference to FIG. 1. First, when in a light-blocking state, a power voltage VDD may be applied to a drain region of the reset transistor Rx and a drain region of the source follower transistor Sx to discharge electric charges from the floating diffusion region FD. Thereafter, if the reset transistor Rx is turned-off and external light is incident into the photoelectric conversion region PD, electron-hole pairs may be generated in the photoelectric conversion region PD. Holes may be moved toward the p-type doped region, and electrons may be moved toward and accumulated in the n-type doped region. If the transfer transistor Tx is turned on, the electrons may be transferred to and accumulated in the floating diffusion region FD. A change in amount of the accumulated electrons may lead to a change in gate bias of the source follower transistor Sx, and this may lead to a change in source potential of the source follower transistor Sx. Accordingly, if the selection transistor Ax is turned on, an amount of the electrons may be read out as a signal to be transmitted through a column line.

Figure 2:
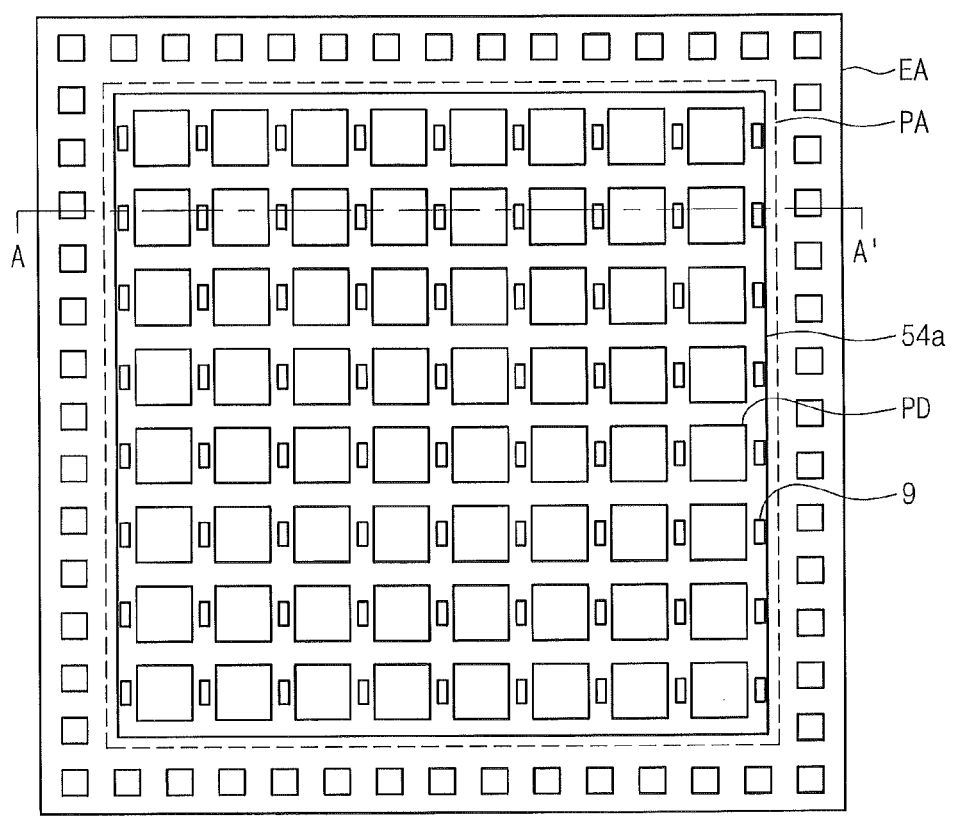
FIG. 2 is a layout diagram illustrating an image sensor according to example embodiments of the inventive concept.

FIG. 2 is a layout diagram illustrating an image sensor according to example embodiments of the inventive concept. FIG. 3 is a sectional view taken along line A-A' of FIG. 2. FIGS. 4A through 4D are plan views enlarging a portion of FIG. 2.

Referring to FIGS. 2 and 3, a device isolation layer 3 may be disposed on a substrate 1 with a pixel region PA and a peripheral region EA. The substrate 1 may be doped with, for example, p-type dopants. The device isolation layer 3 may be formed on the pixel region PA to delimit active regions for a plurality of unit pixels. Each unit pixel may include a photoelectric conversion portion PD formed in the substrate 1. The photoelectric conversion portion PD may be a photodiode including a first doped region 5 and a second doped region 7 that are formed to have conductivity types opposite to each other. The first doped region 5 may be doped with, for example, n-type dopants. The second doped region 7 may be doped with, for example, p-type dopants. For example, the photoelectric conversion portion PD may be provided in pixels for sensing red light and blue light. A storage node region 9 may be provided in the substrate 1 of the pixel region PA. The storage node region 9 may be electrically separated from the photoelectric conversion portion PD and be configured to sense, for example, green light. The storage node region 9 may be doped with, for example, n-type dopants. The storage node region 9 may have an area that is smaller than that of the photoelectric conversion portion PD. Although not shown, a transfer gate may be provided on a portion of the substrate 1 adjacent to the storage node region 9, and a floating diffusion region may be provided in a portion of the substrate 1 adjacent to the photoelectric conversion portion PD.

Peripheral circuit transistors TR may be disposed on the peripheral region EA of the substrate 1.

An interlayered dielectric structure 30 may be provided on the substrate 1. The interlayered dielectric structure 30 may include first to sixth interlayered insulating layers 11-13, 16, 19, and 20, etch stop layers 14 and 17, remaining insulating layers 15 and 18, and a passivation layer 21. The first to sixth interlayered insulating layers 11-13, 16, 19, and 20 and the remaining insulating layers 15 and 18 may be formed of oxide materials. The etch stop layers 14 and 17 may be formed of nitride materials. The passivation layer 21 may be formed of at least one of silicon nitride or polyimide.

A first interconnection structure 50a and a second interconnection structure 50b may be provided in the interlayered dielectric structure 30. The first and second interconnection structures 50a and 50b may be provided on the pixel region PA and the peripheral region EA, respectively. The first and second interconnection structures 50a and 50b may include a plurality of first vias 41a and 42a and a plurality of second vias 41b and 42b, respectively. The first vias 41a and 42a may be formed at the same levels as the second vias 41b and 42b, respectively, and the first vias 41a and 42a may be formed of the same materials as those of the second vias 41b and 42b, respectively. The first interconnection structure 50a may not overlap the photoelectric conversion portion PD, in plan view. The first interconnection structure 50a may be electrically connected to the storage node region 9. The second interconnection structure 50b may include an uppermost wire 43 provided at the uppermost level thereof. A hole 54b may be formed on the interlayered dielectric structure 30 of the peripheral region EA to expose the uppermost wire 43, and a conductive pad 56 may be provided in the hole 54b to be connected to the uppermost wire 43. Although not shown, a bump or a wire may be attached to a top surface of the conductive pad 56.

A first recess region 54a may be formed on the interlayered dielectric structure 30 of the pixel region PA. A plurality of second recess regions 62a and 62b may be formed below the first recess region 54a. The second recess regions 62a and 62b may be formed to overlap the unit pixels, respectively. The first interconnection structure 50a may be disposed beside the second recess regions 62a and 62b. The first interconnection structure 50a may be provided to include a top portion protruding upward from the bottom surface of the first recess region 54a. The first etch stop layer 14 may be provided below the second recess regions 62a and 62b, and the second etch stop layer 17 may be provided below the first recess region 54a. Color filters may be provided in the second recess regions 62a and 62b, respectively. In example embodiments, the color filters may include a first color filter 66a serving as, for example, a blue filter B, and a second color filter 66b serving as, for example, a red filter R.

Figure 4A:
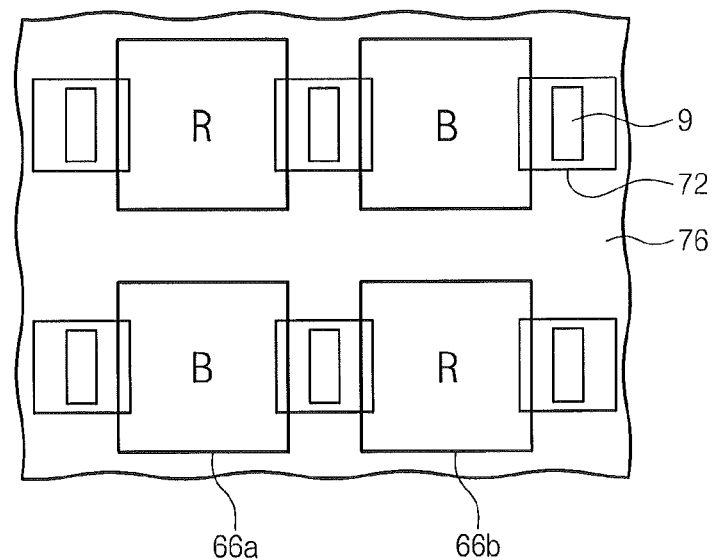
FIGS. 4A through 4D are plan views enlarging a portion of FIG. 2.
Figure 4B:
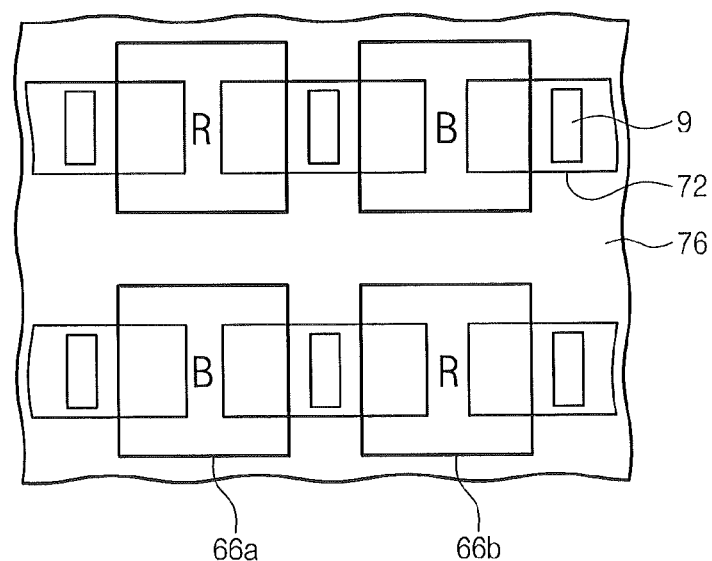
Figure 4C:
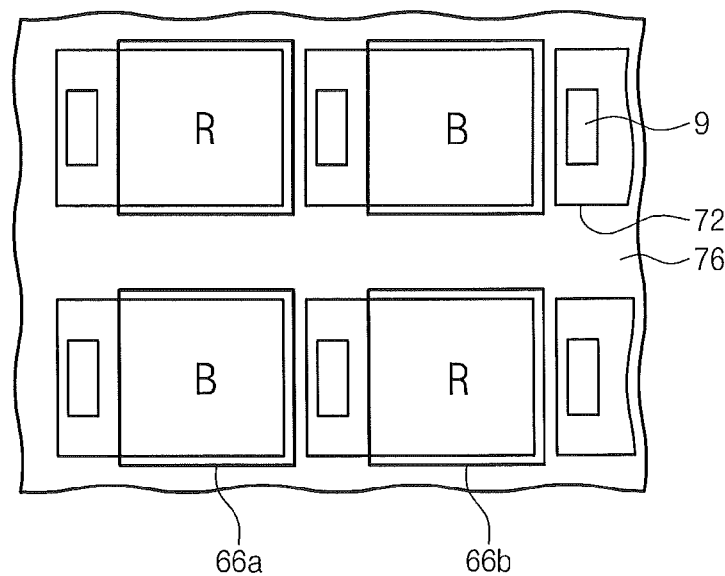
Figure 4D:
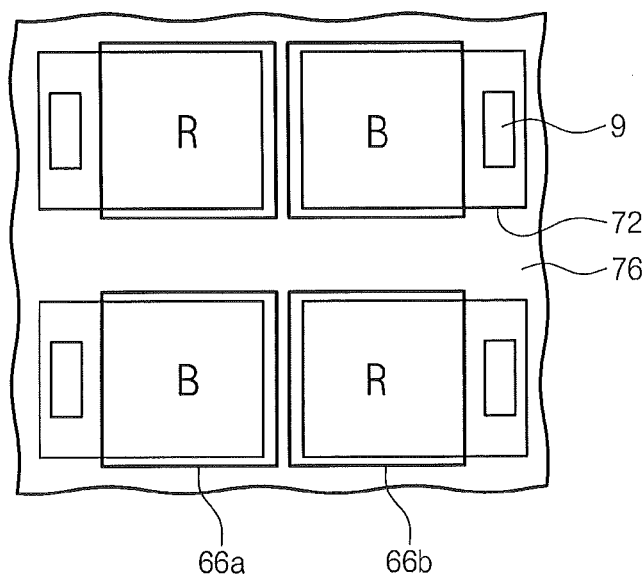

An organic photoelectric layer 74 may be provided on the color filters 66a and 66b and in the first recess region 54a. The organic photoelectric layer 74 may be formed of an organic material. In example embodiments, the organic material for the organic photoelectric layer 74 may be selected to exhibit a photoelectric conversion effect only when light with a specific wavelength is incident thereto. For example, the organic photoelectric layer 74 may be selected to exhibit the photoelectric conversion effect when greed light is incident thereto. A first transparent electrode 72 may be disposed under the organic photoelectric layer 74 and be electrically connected to the first interconnection structure 50a. A second transparent electrode 76 may be disposed to cover the whole top surface of the organic photoelectric layer 74. The transparent electrodes 72 and 76 may include at least one material selected from the group consisting of ITO, IZO, ZnO, SnO2, ATO (antimony-doped tin oxide), AZO (Al-doped zinc oxide), GZO (gallium-doped zinc oxide), TiO2 or FTO (fluorine-doped tin oxide). The first transparent electrode 72 may be provided not to have a portion overlapped with the color filters 66a and 66b, as shown in FIGS. 3 and 4A. Alternatively, the first transparent electrode 72 may extend to be partially overlapped with the color filters 66a and 66b, as shown in FIG. 4B. Here, one of the color filters 66a and 66b may overlap a pair of the first transparent electrodes 72 disposed adjacent to each other. As shown in FIG. 4C or 4D, each first transparent electrode 72 may overlap one of the color filters 66a and 66b disposed adjacent to each other. As mentioned above, dispositions of the first transparent electrode 72 and the color filters 66a and 66b may be variously modified.

The second transparent electrode 76 may extend toward the peripheral region EA to be in contact with the conductive pad 56. A spacer 71 may be provided to cover a sidewall of the first recess region 54a. The spacer 71 may be in contact with all of the first transparent electrode 72, the organic photoelectric layer 74, and the second transparent electrode 76. The spacer 71 may be formed of, for example, an insulating material.

A first protection layer 64 may be interposed between the color filters 66a and 66b and the interlayered dielectric structure 30. A second protection layer 68 may be interposed between the organic photoelectric layer 74 and the color filters 66a and 66b. The protection layers 64 and 68 may be formed of at least one of oxide or nitride materials.

A plurality of micro lenses 78 may be disposed on the second transparent electrode 76, which overlap the unit pixels, respectively.

In example embodiments, the image sensor may be configured in such a way that the organic photoelectric layer 74 causing a photoelectric conversion of a green light is provided on the whole region of the pixel region, and thus, it is unnecessary to provide or form an additional color filter for the green light. Accordingly, lights of two different colors can be detected by each unit pixel, and thus, it is possible to realize a highly-integrated image sensor. Further, because the organic photoelectric layer 74 is disposed on the whole ration of the pixel region, it is possible to improve light-receiving efficiency and resolution of the device.

In the pixel region PA, the interlayered dielectric structure 30 may be formed to have the recess regions 54a, 62a, and 62b, and thus, a distance from the micro lens 78 to the photoelectric conversion portion PD can be reduced and an aspect ratio of the pixel can be reduced. Accordingly, it is possible to improve an optical sensitivity of the device and reduce the cross-talk problem between pixels.

FIGS. 5 through 15 are sectional views illustrating a process of forming an image sensor of FIG. 3.

Figure 5:
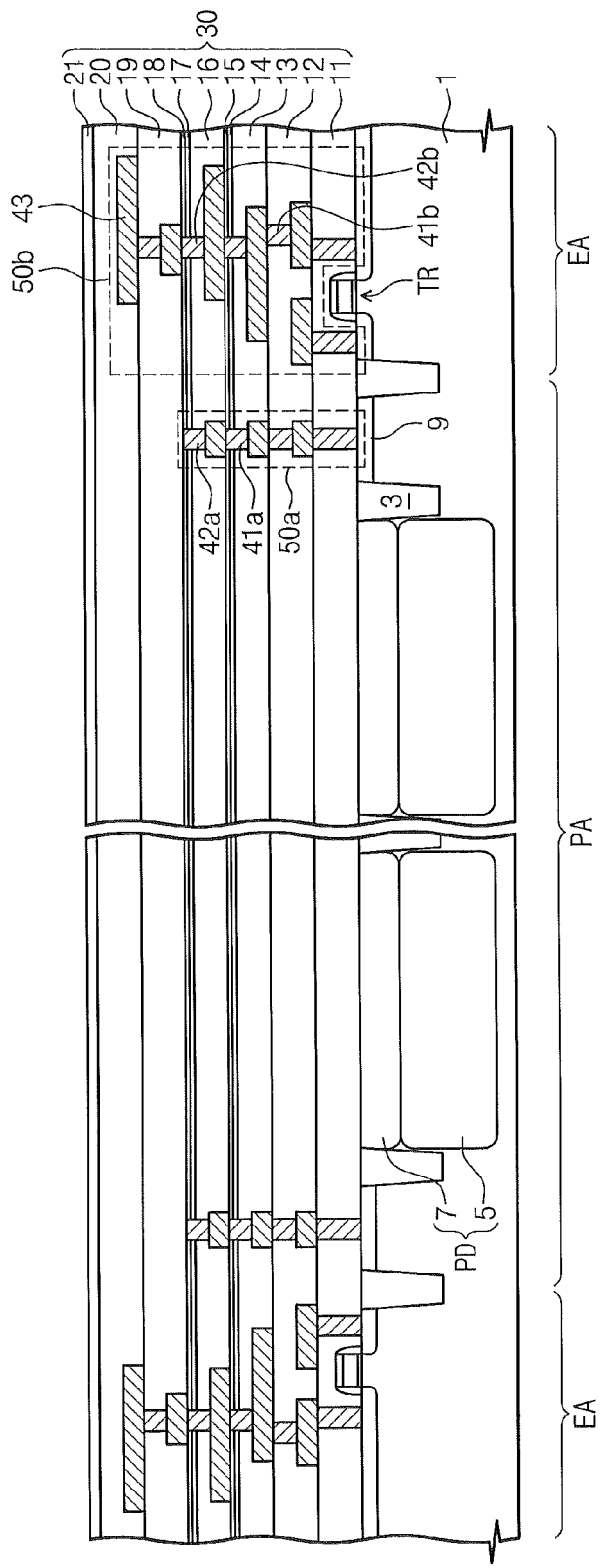
FIGS. 5 through 15 are sectional views illustrating a process of forming an image sensor of FIG. 3.

Referring to FIG. 5, the device isolation layer 3 may be formed on the substrate 1 with the pixel region PA and the peripheral region EA to delimit active regions. The substrate 1 may be doped with, for example, p-type dopants. Ion implantation processes may be performed to form the photoelectric conversion portion PD and the storage node region 9 in the substrate 1. Transistors TR may be formed on the substrate 1. Thereafter, a layer-deposition process and a layer-etching process may be repeatedly performed to form the interlayered dielectric structure 30 and the interconnection structures 50a and 50b. For example, first and second interlayered insulating layers 11 and 12 and first conductive elements (vias, contacts, pads, and interconnection lines) may be formed on the substrate 1. Thereafter, the third interlayered insulating layer 13, the first etch stop layer 14, and the first remaining insulating layer 15 may be formed. The first vias 41a and 41b may be simultaneously formed to be in contact with the first conductive elements through the first remaining insulating layer 15, the first etch stop layer 14, and the third interlayered insulating layer 13. The first to third interlayered insulating layers 11-13 and the first remaining insulating layer 15 may be formed of the same oxide material. The first etch stop layer 14 may be formed of a nitride material. Second conductive elements (pad and wires) may be formed on the first vias 41a and 41b to be in contact with them, and the fourth interlayered insulating layer 16, the second etch stop layer 17, and the second remaining insulating layer 18 may be sequentially formed to cover them. Thereafter, the second vias 42a and 42b may be simultaneously formed to be in contact with second conductive elements (pads and wires) through the second remaining insulating layer 18, the second etch stop layer 17, and the fourth interlayered insulating layer 16. Because the first and second vias 41a, 41b, 42a, and 42b may be formed on both of the pixel and peripheral regions, the first interconnection structure 50a can be formed without performing an additional process.

The fifth interlayered insulating layer 19, the uppermost wire 43, the sixth interlayered insulating layer 20, and the passivation layer 21 may be sequentially formed on the second remaining insulating layer 18. In example embodiments, the interconnection structures 50a and 50b may be formed so as not to overlap with the photoelectric conversion portion PD.

Figure 6:
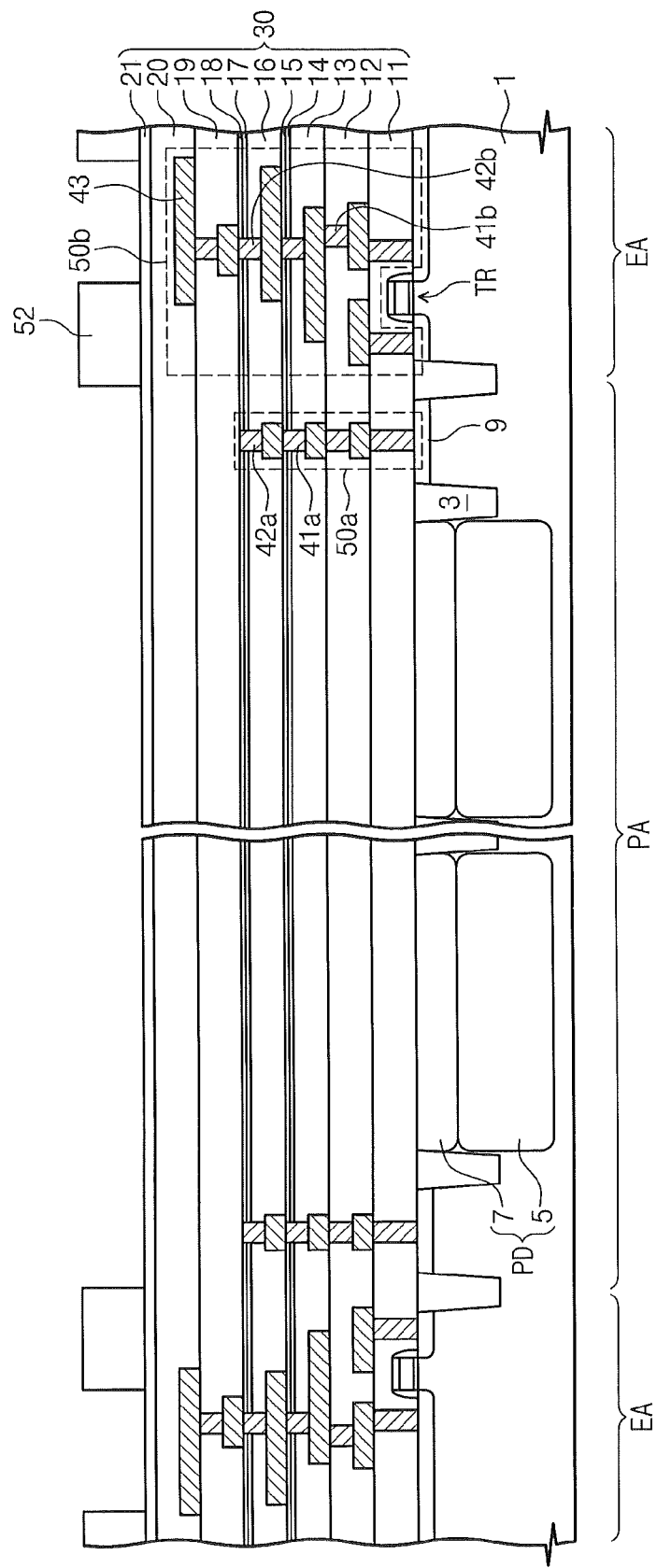

Referring to FIG. 6, a first mask pattern 52 may be formed on the passivation layer 21. The first mask pattern 52 may have openings, each of which is formed to expose partially the pixel region PA or the uppermost wire 43. The first mask pattern 52 may be, for example, a photoresist pattern.

Figure 7:
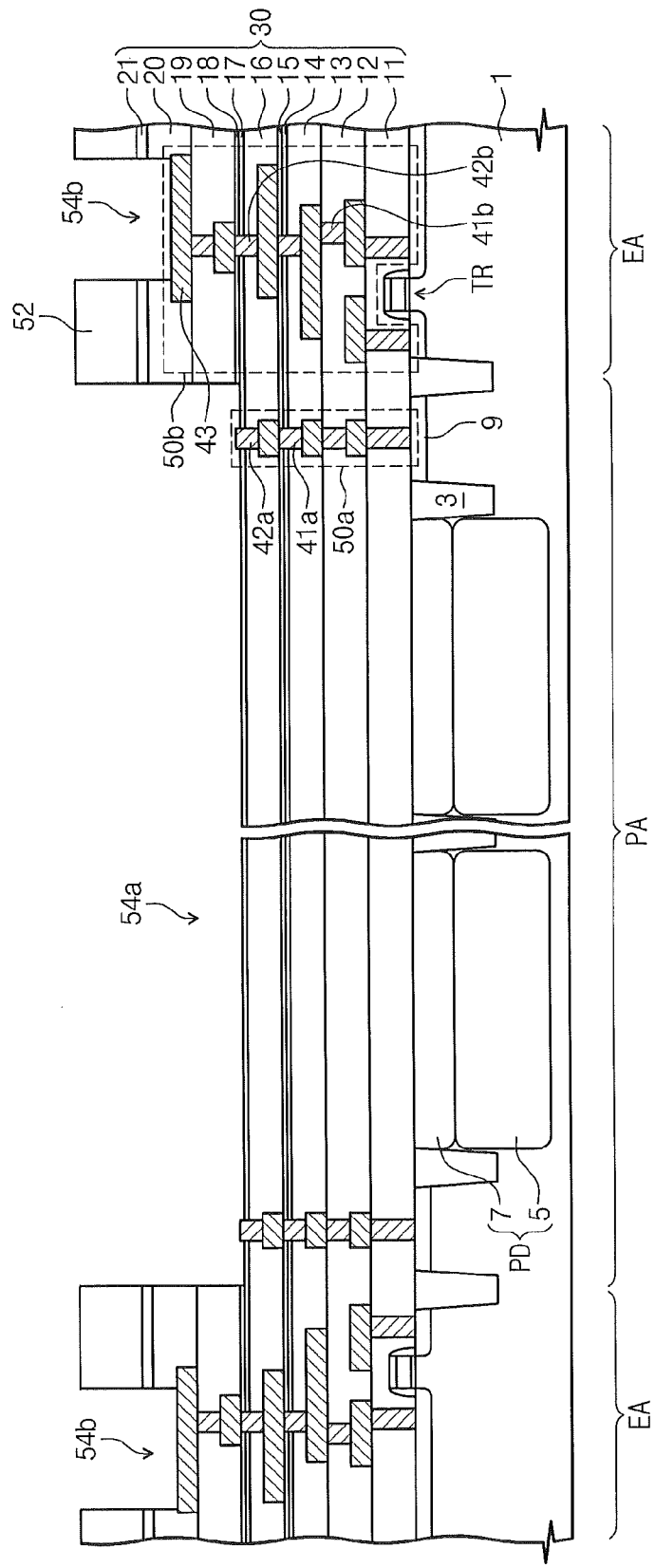

Referring to FIG. 7, the passivation layer 21 and the sixth interlayered insulating layer 20 on the peripheral region EA may be sequentially patterned to form the hole 54b exposing the uppermost wire 43. At the same time, the passivation layer 21, the sixth and fifth interlayered insulating layers 20 and 19, and the remaining insulating layer 18 on the pixel region PA may be sequentially etched to form the first recess region 54a exposing the second etch stop layer 17. The formation of the first recess region 54a and the hole 54b may be performed using the first mask pattern 52 as an etch mask. In example embodiments, the first recess region 54a may be formed to have a bottom surface lower than a top portion of the second via 42a of the first interconnection structure 50a.

Figure 8:
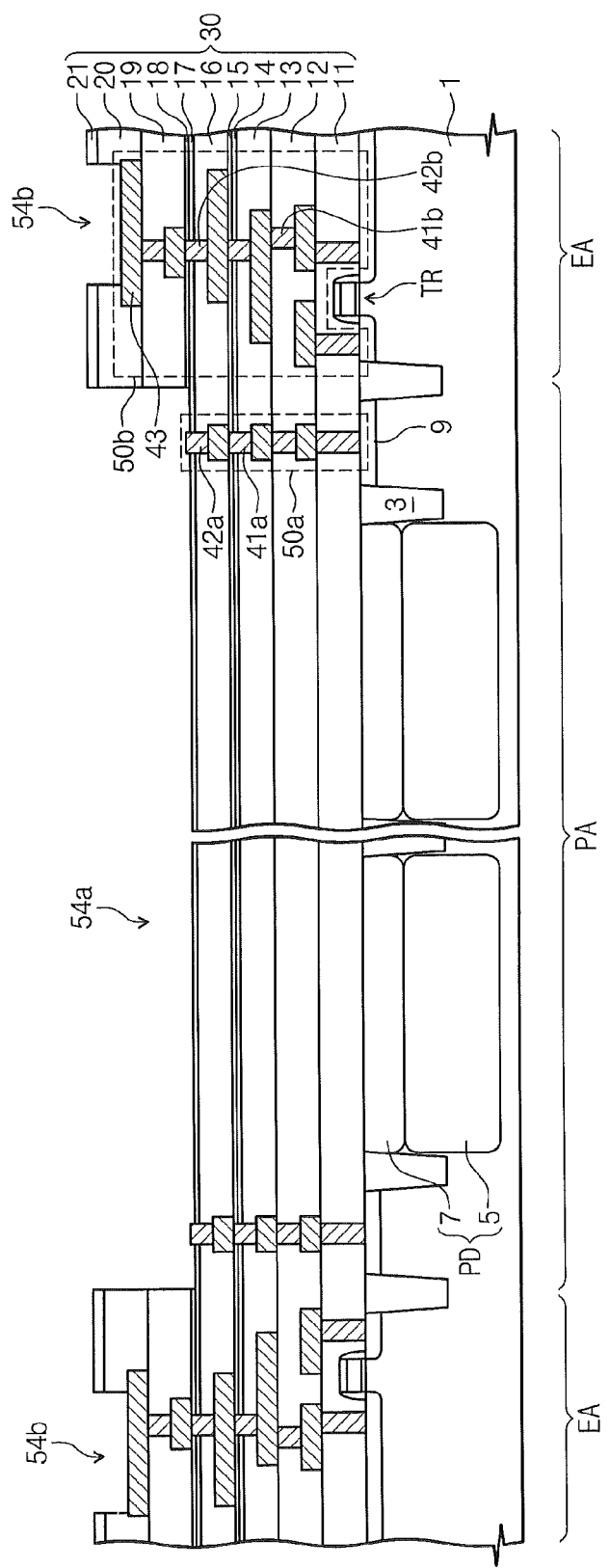

Referring to FIG. 8, the first mask pattern 52 may be selectively removed to expose a top surface of the passivation layer 21. If the first mask pattern 52 is the photoresist pattern, it may be removed by an ashing process.

Figure 9:
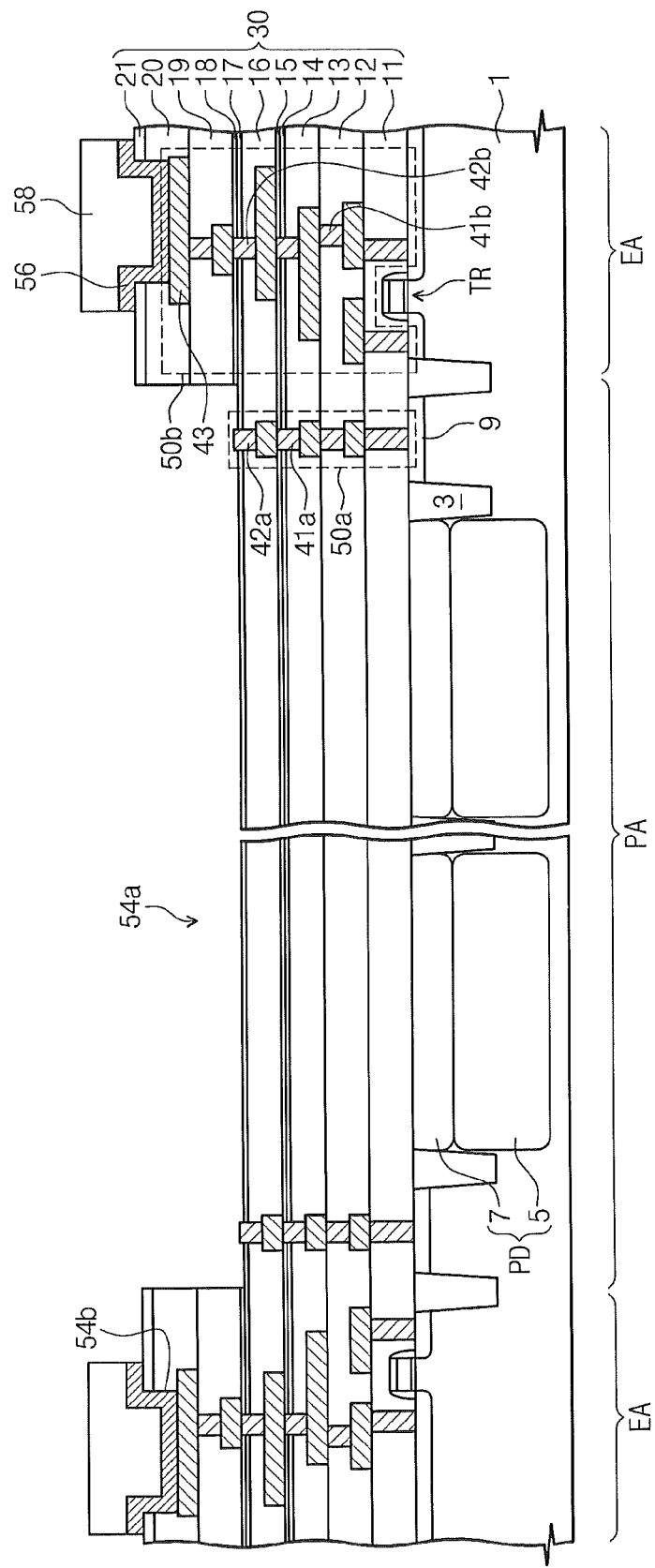

Referring to FIG. 9, a conductive layer may be conformally deposited on the interlayered dielectric structure 30 with the first recess region 54a and the hole 54b. A second mask pattern 58 may be formed on the conductive layer to expose the first recess region 54a. The second mask pattern 58 may overlap the uppermost wire 43. Thereafter, the conductive layer may be etched using the second mask pattern 58 as an etch mask to form the conductive pad 56. The conductive pad 56 may be connected to the uppermost wire 43 through the hole 54b.

Figure 10:
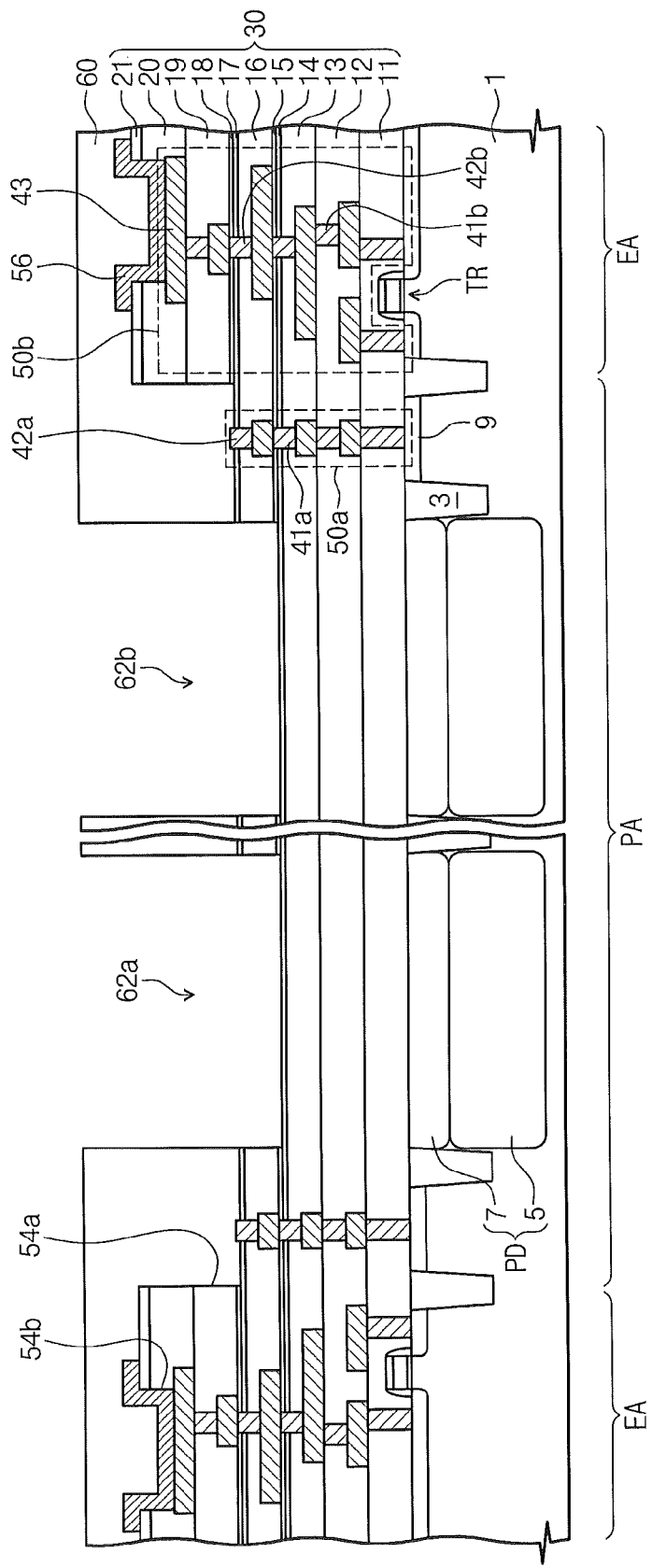

Referring to FIG. 10, the second mask pattern 58 may be selectively removed. A third mask pattern 60 may be formed to cover the peripheral region EA and the first interconnection structure 50a and to have a plurality of openings. Each of the openings of the third mask pattern 60 may be formed to expose a bottom surface of the first recess region 54a. The second etch stop layer 17, the fourth interlayered insulating layer 16, and the first remaining insulating layer 15 may be sequentially etched using the third mask pattern 60 as an etch mask. As a result, a plurality of second recess regions 62a and 62*b* may be formed to expose the first etch stop layer 14 through the first recess region 54*a*.

Figure 11:
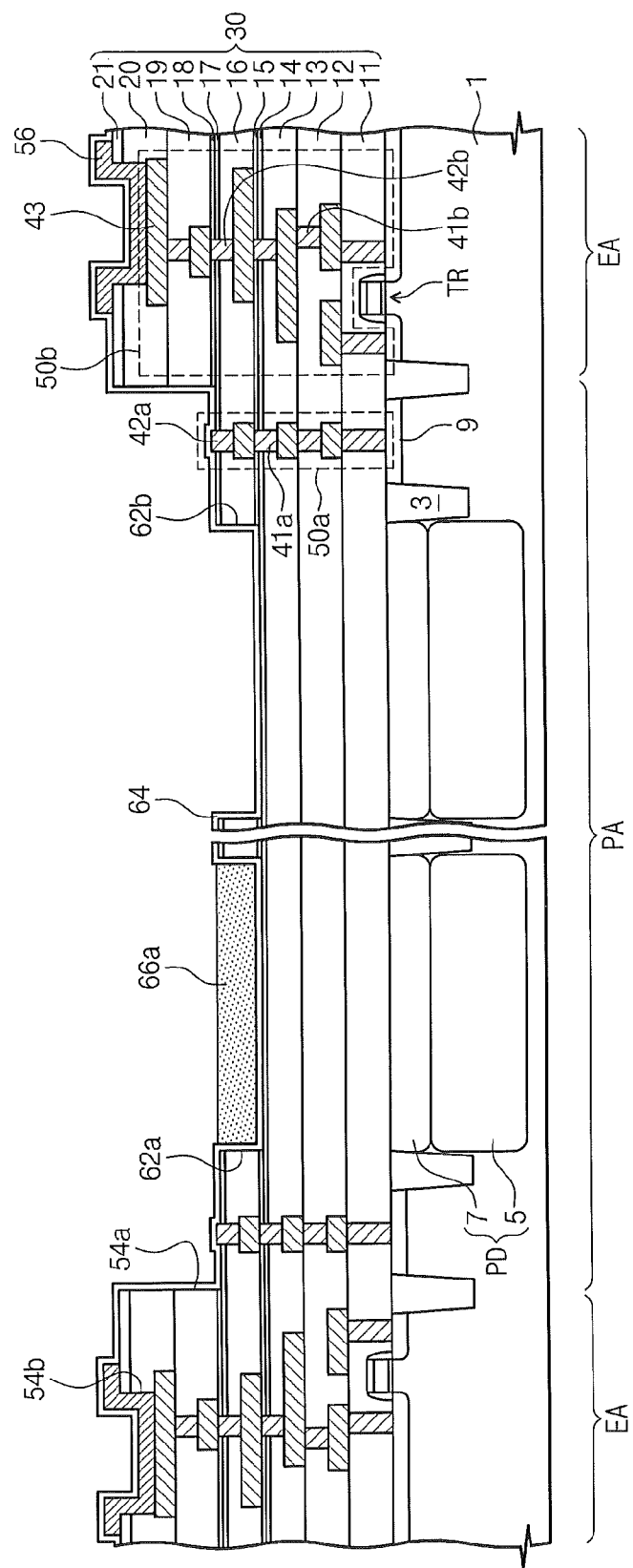

Referring to FIG. 11, the third mask pattern 60 may be selectively removed. The first protection layer 64 may be conformally deposited on the interlayered dielectric structure 30. The first protection layer 64 may be formed of at least one of oxide or nitride materials. Next, the first color filter 66*a* may be formed in one (for example, 62*a* as shown in FIG. 11) of the second recess regions 62*a* and 62*b*. In example embodiments, the first color filter 66*a* may be formed of a photoresist pattern including a pigment by a photolithography process. Here, the first protection layer 64 may be configured to protect the second via 42*a* of the first interconnection structure 50*a* and the conductive pad 56 against a development solution.

Figure 12:
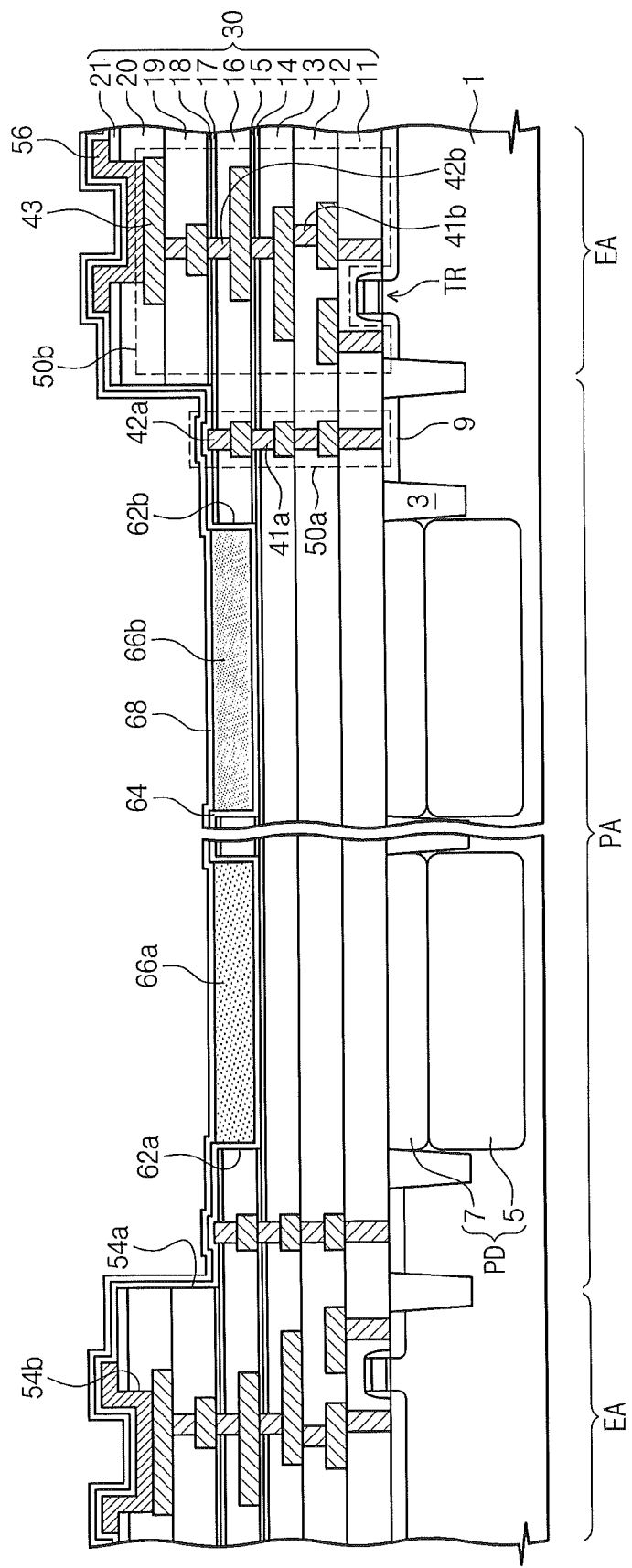

Referring to FIG. 12, the second color filter 66*b* may be formed in the other (for example, 62*b*) of the second recess regions 62*a* and 62*b*. The second color filter 66*b* may be formed to have or display a different color from the first color filter 66*a*. The color filters 66*a* and 66*b* may be formed to fill the second recess regions 62*a* and 62*b*, respectively. The second protection layer 68 may be conformally formed on the resulting structure provided with the color filters 66*a* and 66*b*. The second protection layer 68 may be formed of at least one of oxide or nitride materials.

Figure 13:
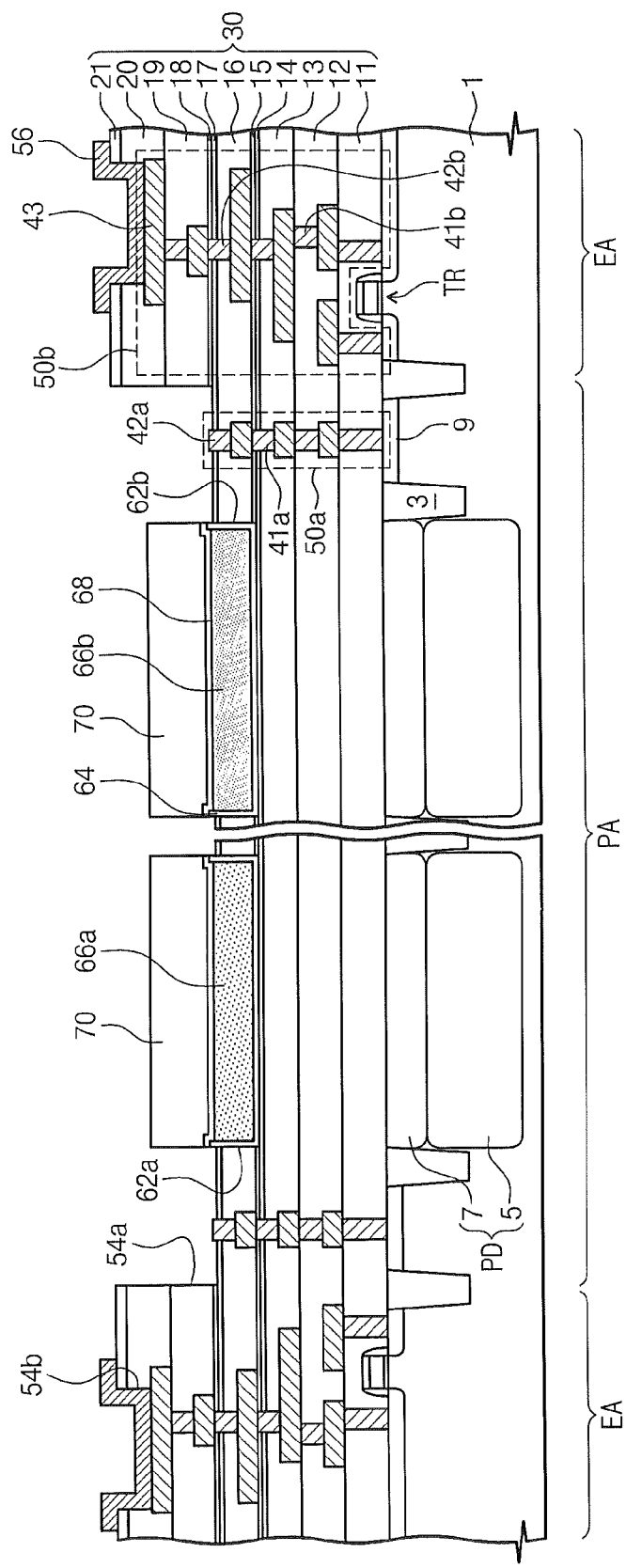

Referring to FIG. 13, a fourth mask pattern 70 may be formed on the interlayered dielectric structure 30 so as to overlap the color filters 66*a* and 66*b*. The fourth mask pattern 70 may be formed to expose the second via 42*a* of the first interconnection structure 50*a* and the conductive pad 56. The protection layers 68 and 64 may be sequentially etched using the fourth mask pattern 70 as an etch mask to expose a top of the second via 42*a* and the conductive pad 56. The fourth mask pattern 70 may be formed of, for example, a photoresist pattern.

Figure 14:
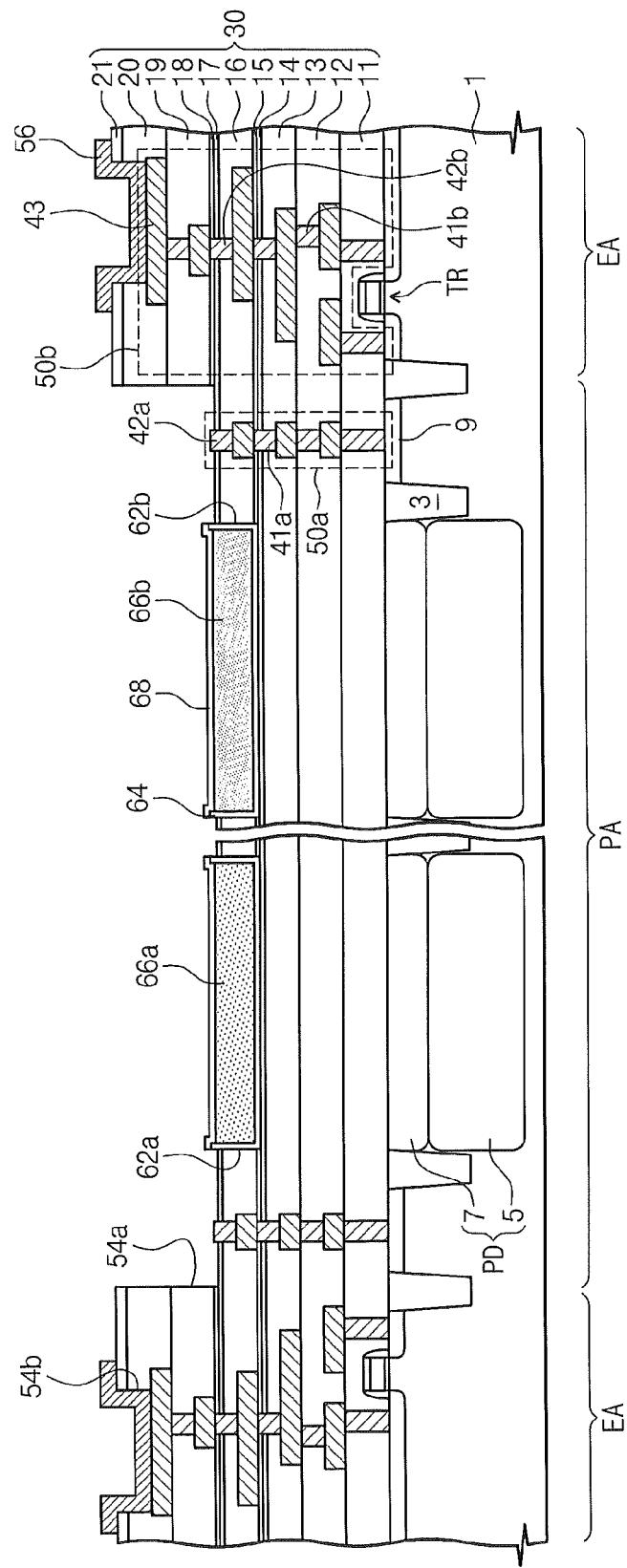

Referring to FIG. 14, the fourth mask pattern 70 may be selectively removed. In the case where the fourth mask pattern 70 is a photoresist pattern, it may be removed by an ashing process. Here, the second protection layer 68 may be configured to protect the color filters 66*a* and 66*b* from the ashing process.

Figure 15:
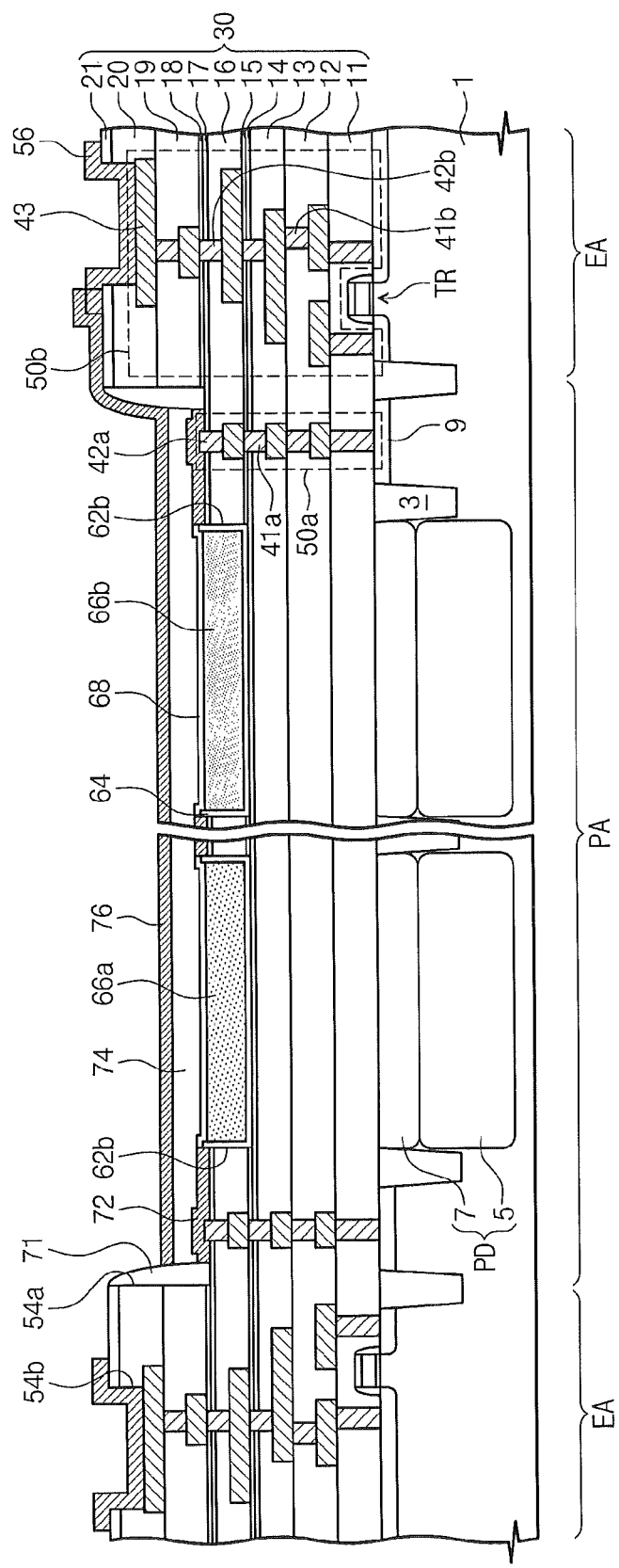

Referring to FIG. 15, the spacer 71 may be formed to cover the sidewall of the first recess region 54*a*. The first transparent electrode 72 may be formed to be in contact with the second via 42*a* or the first interconnection structure 50*a*. The organic photoelectric layer 74 and the second transparent electrode 76 may be sequentially formed in the first recess region 54*a*. The second transparent electrode 76 may extend to be in contact with the conductive pad 56. Due to the presence of the spacer 71, it is possible to reduce an angle of the sidewall of the first recess region 54*a* and thus, the second transparent electrode 76 can be easily connected to the conductive pad 56.

Referring back to FIG. 3, micro lenses 78 may be formed on the second transparent electrode 76, which overlap the photoelectric conversion portions PD, respectively.

Figure 16:
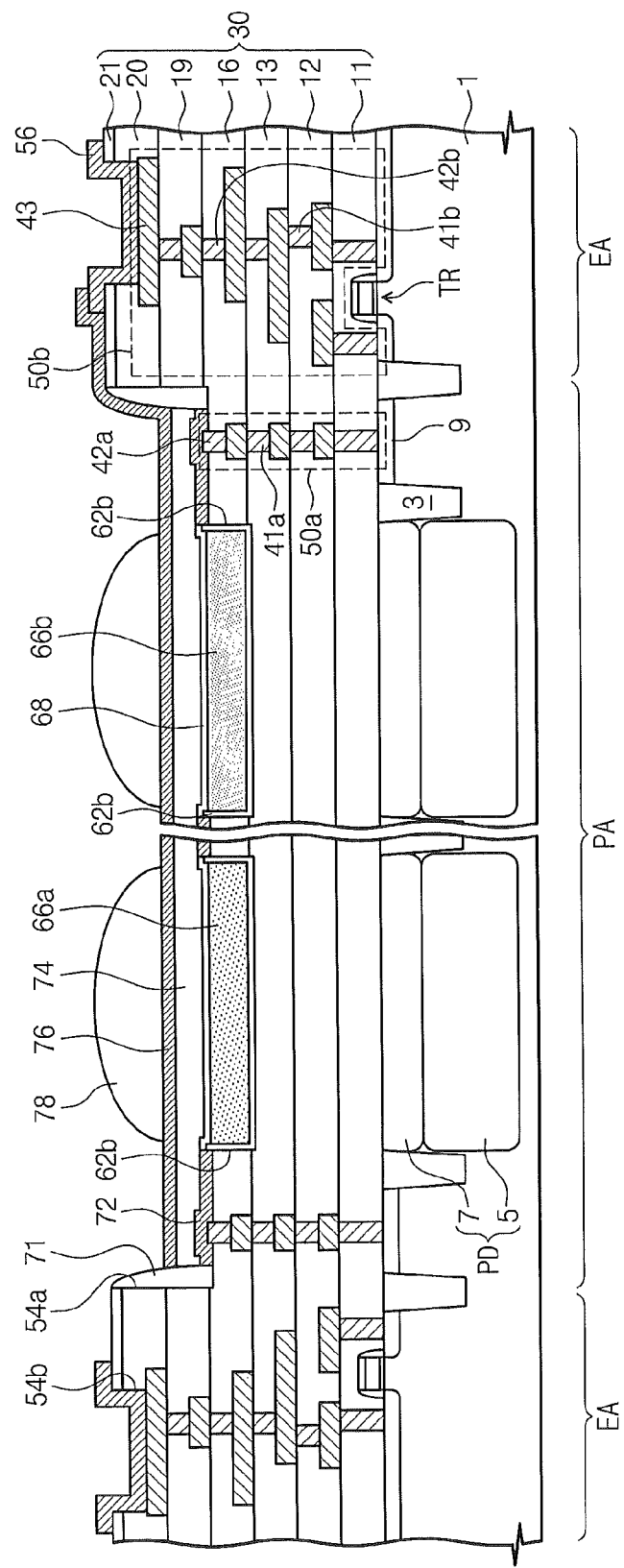
FIGS. 16 and 17 are sectional views taken along line A-A' of FIG. 2 to describe an image sensor according to other example embodiments of the inventive concept.
Figure 17:
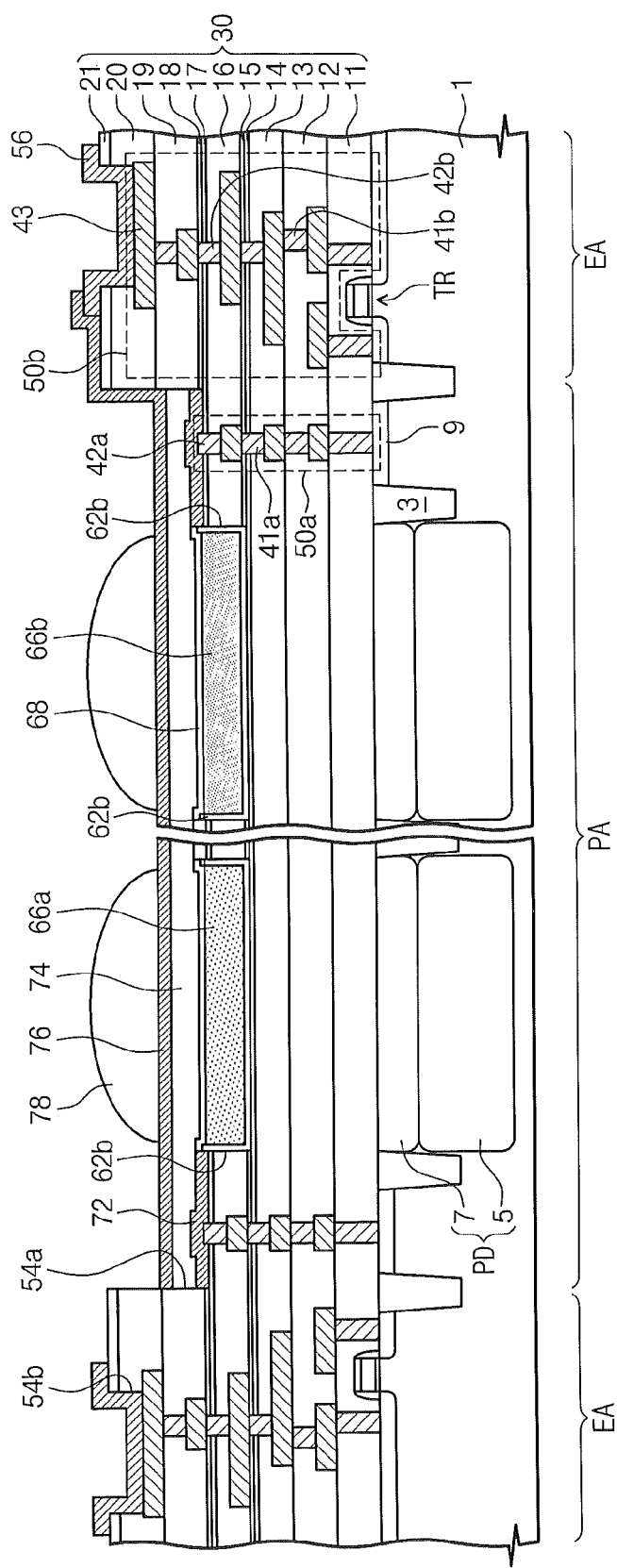

FIGS. 16 and 17 are sectional views taken along line A-N of FIG. 2 to describe an image sensor according to other example embodiments of the inventive concept.

Referring to FIG. 16, the image sensor according to the present embodiment may be configured not to include the etch stop layers 14 and 17 and the remaining insulating layers 15 and 18 of FIG. 3. Except for this difference, the image sensor according to the present embodiment may be configured to have substantially the same features as those of the previous embodiments of FIG. 3.

Referring to FIG. 17, the image sensor according to the present embodiment may be configured not to include the spacer 71 of FIG. 3. Except for this difference, the image sensor according to the present embodiment may be configured to have substantially the same features as those of the previous embodiments of FIG. 3.

Figure 18:
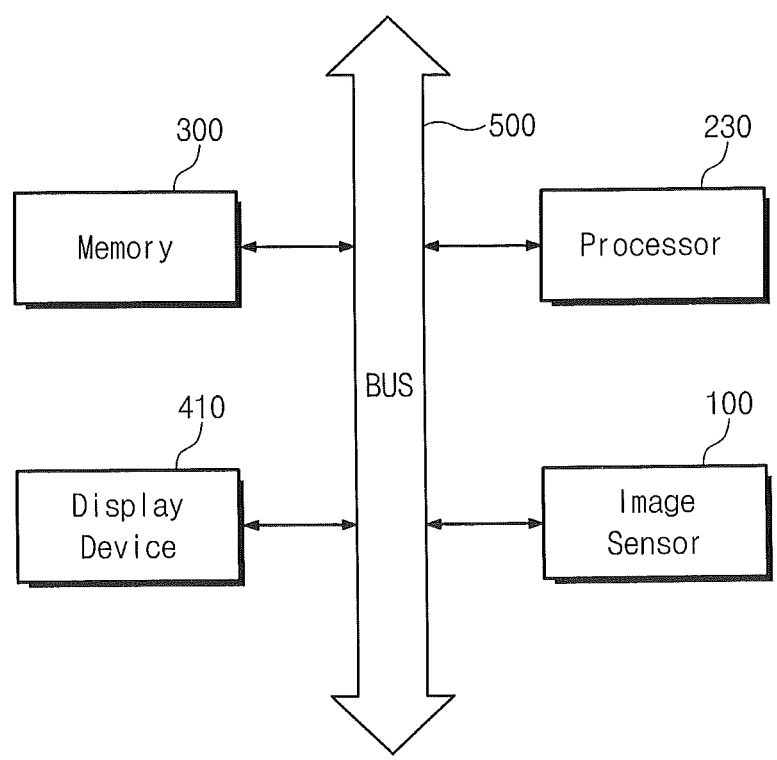
FIG. 18 is a block diagram illustrating an example of electronic devices including an image sensor according to example embodiments of the inventive concept.
Figure 19:
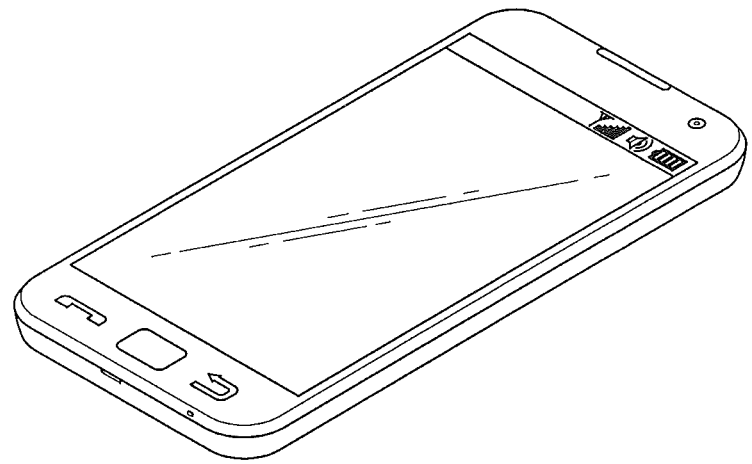
FIGS. 19 through 23 are perspective views exemplarily illustrating multimedia devices including an image sensor according to example embodiments of the inventive concept.
Figure 20:
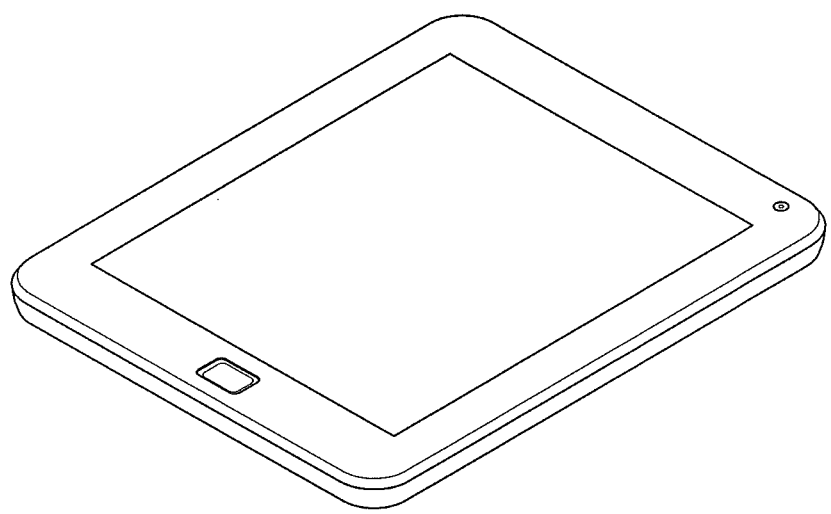
Figure 21:
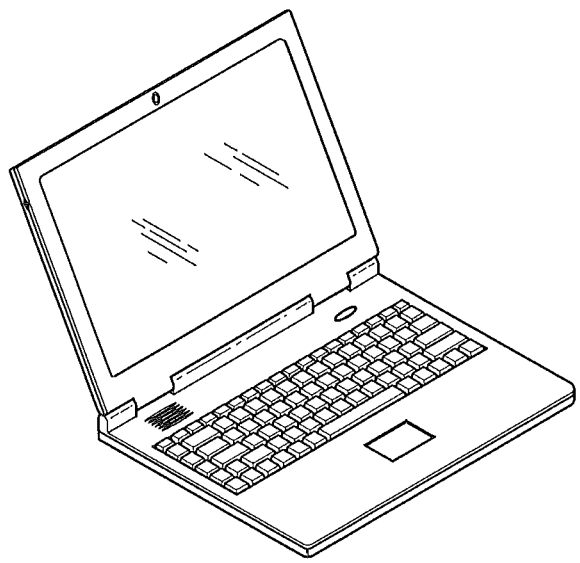
Figure 22:
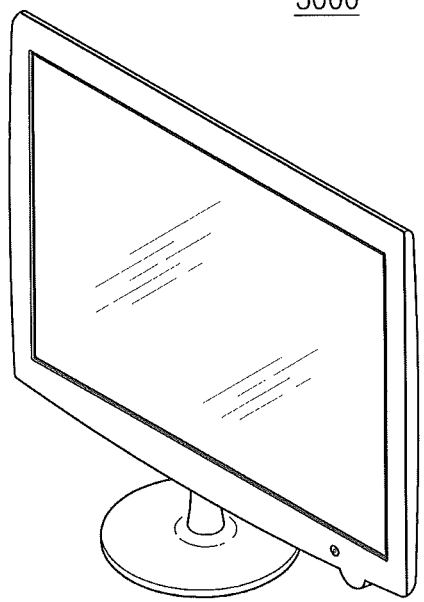
Figure 23:
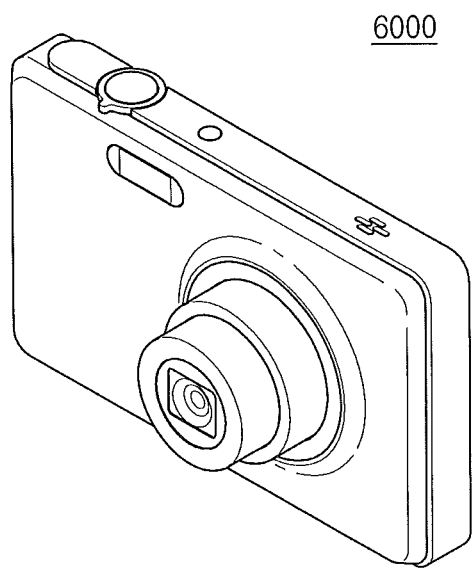

FIG. 18 is a block diagram illustrating an electronic device having an image sensor, according to example embodiments of the inventive concept. The electronic device may be any of various types of devices, such as a digital camera or a mobile device, for example. Referring to FIG. 18, an illustrative digital camera system includes an image sensor 100, a processor 200, a memory 300, a display 400 and a bus 500. As shown in FIG. 18, the image sensor 100 captures an external image under control of the processor 200, and provides the corresponding image data to the processor 200 through the bus 500. The processor 200 may store the image data in the memory 300 through the bus 500. The processor 200 may also output the image data stored in the memory 300, e.g., for display on the display device 400.

FIGS. 19 through 23 show examples of multimedia devices, to which image sensors according to example embodiments of the inventive concept can be applied. Image sensors according to example embodiments of the inventive concept can be applied to a variety of multimedia devices with an imaging function. For example, image sensors according to example embodiments of the inventive concept may be applied to a mobile phone or a smart phone 2000 as exemplarily shown in FIG. 19, to a tablet PC or a smart tablet PC 3000 as exemplarily shown in FIG. 20, to a laptop computer 4000 as exemplarily shown in FIG. 21, to a television set or a smart television set 5000 as exemplarily shown in FIG. 22, and to a digital camera or a digital camcorder 6000 as exemplarily shown in FIG. 23.

According to example embodiments of the inventive concept, the image sensor may be configured in such a way that the organic photoelectric layer causing a photoelectric conversion of a green light is provided on the whole region of the pixel region, and thus, it is unnecessary to provide or form an additional color filter for the green light. Accordingly, lights of two different colors can be detected by each unit pixel, and thus, it is possible to realize a highly-integrated image sensor. Further, because the organic photoelectric layer is disposed on the whole ration of the pixel region, it is possible to improve light-receiving efficiency and resolution of the device.

In the pixel region, the interlayered dielectric structure may be formed to have the recess regions, and thus, a distance between the micro lens and the photoelectric conversion portion can be reduced and an aspect ratio of the pixel can be reduced. Accordingly, it is possible to improve an optical sensitivity of the device and reduce the cross-talk problem between pixels.

According to example embodiments of the inventive concept, in a process of fabricating an image sensor, the first interconnection structure electrically connected to the first transparent electrode below the organic photoelectric layer may be formed using a process for forming the second interconnection structure on the peripheral region. Accordingly, an additional process for forming the first interconnection structure can be omitted, and thus, it is possible to reduce fabrication cost of the device.

Further, during the process of fabricating the image sensor, a protection layer may be formed before the formation of the color filter and the organic photoelectric layer, and thus, it is possible to prevent or reduce the likelihood of vias of the interconnection structures being damaged and to protect the color filter.

While example embodiments of the inventive concepts have been particularly shown and described, it will be understood by one of ordinary skill in the art that variations in form and detail may be made therein without departing from the spirit and scope of the attached claims.

What is claimed is:

1. An image sensor, comprising:
a substrate including a pixel region and a peripheral region;
an interlayered dielectric structure disposed on the substrate and having a first recess region formed on the pixel region and a second recess region formed below a bottom of the first recess region;
a color filter disposed in the second recess region; and
an organic photoelectric layer disposed in the first recess region.

2. The image sensor of claim 1, further comprising:
a photoelectric conversion portion formed in the substrate and overlapped with the color filter; and
a micro lens disposed on the organic photoelectric layer and overlapped with the color filter.

3. The image sensor of claim 1, further comprising:
a first transparent electrode disposed in the first recess region and below the organic photoelectric layer; and
a second transparent electrode disposed in the first recess region and on the organic photoelectric layer.

4. The image sensor of claim 3, further comprising a conductive pad on the interlayered dielectric structure at the peripheral region,
wherein the second transparent electrode covers an entire top surface of the organic photoelectric layer and extends so as to be in contact with the conductive pad.

5. The image sensor of claim 4, further comprising a spacer covering a sidewall of the first recess region and being in contact with the second transparent electrode.

6. The image sensor of claim 4, further comprising:
a storage node region formed in the substrate and electrically isolated from the photoelectric conversion portion; and
a first interconnection structure formed through the interlayered dielectric structure to electrically connect the first transparent electrode to the storage node region.

7. The image sensor of claim 6, wherein the first interconnection structure comprises a top portion protruding from the bottom of the first recess region.

8. The image sensor of claim 6, further comprising a second interconnection structure disposed on the peripheral region and electrically connected to the conductive pad,
wherein the first interconnection structure comprises a plurality of first vias,
the second interconnection structure comprises a plurality of second vias, and
at least one of the first vias is disposed at the same level as that of at least one of the second vias.

9. The image sensor of claim 3, wherein the first transparent electrode is overlapped with the color filter.

10. The image sensor of claim 3, further comprising an etch stop layer interposed in at least one of a plurality of gaps between the first transparent electrode and the interlayered dielectric structure and between the color filter and the interlayered dielectric structure.

11. The image sensor of claim 1, further comprising a protection layer interposed in at least one of a plurality of gaps between the color filter and the interlayered dielectric structure and between the color filter and the organic photoelectric layer.

12. The image sensor of claim 11, wherein the protection layer is formed of at least one of oxide and nitride materials.

13. An image sensor, comprising:
a substrate including a pixel region and a peripheral region;
a plurality of photoelectric conversion portions in the pixel region;
an interlayered dielectric structure disposed on the substrate and having a first recess region formed on the pixel region;
a plurality of second recess regions disposed within the first recess region;
an organic photoelectric layer disposed in the first recess region on the pixel region so as to cover the plurality of photoelectric conversion portions in their entireties; and
a plurality of color filters disposed between the plurality of photoelectric conversion portions and the organic photoelectric layer, the plurality of color filters being disposed on the plurality of the second recess regions and aligned with the plurality of photoelectric conversion portions, respectively.

14. The image sensor of claim 13, further comprising:
a plurality of micro-lenses disposed on the organic photoelectric layer and aligned with the plurality of photoelectric conversion portions, respectively.

15. The image sensor of claim 13, further comprising:
a first transparent electrode disposed in the first recess region between the organic photoelectric layer and the substrate; and
a second transparent electrode disposed in the first recess region, the organic photoelectric layer being between the second transparent electrode and the substrate.

* * * * *